United States Patent
Lou

(10) Patent No.: US 6,403,471 B1
(45) Date of Patent: Jun. 11, 2002

(54) METHOD OF FORMING A DUAL DAMASCENE STRUCTURE INCLUDING SMOOTHING THE TOP PART OF A VIA

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/429,601

(22) Filed: Oct. 28, 1999

(30) Foreign Application Priority Data

Oct. 2, 1999 (TW) ........................ 88116997 A

(51) Int. Cl.⁷ ..................... H01L 21/4763; H01L 21/44
(52) U.S. Cl. ................. 438/640; 438/622; 438/623; 438/625; 438/627; 438/632; 438/638; 438/660; 438/685; 438/687; 438/688
(58) Field of Search .................. 438/622–627, 438/629, 632, 634, 637, 638–640, 643, 660, 672–673, 685, 687, 688, 780–782, 791

(56) References Cited

U.S. PATENT DOCUMENTS

| | | | | |
|---|---|---|---|---|
| 4,988,423 A | * | 1/1991 | Yamamoto et al. | 204/192.17 |
| 5,989,970 A | * | 11/1999 | Ohkawa et al. | 438/384 |
| 6,093,966 A | * | 7/2000 | Venkatraman et al. | 257/751 |
| 6,143,650 A | * | 11/2000 | Pramanick et al. | 438/643 |

* cited by examiner

Primary Examiner—Ha Tran Nguyen
(74) Attorney, Agent, or Firm—Jiawei Huang; J.C. Patents

(57) ABSTRACT

A dual damascene manufacturing process, which is applicable on a dual damascene structure, is described. The etching stop layer at a bottom of the trench line is removed followed by a thermal treatment to smooth out the surface at the bottom of the trench line and in the via to form a larger and smoother opening at the top part of the via. The via and the trench line are then filled with a barrier layer and a metal layer.

23 Claims, 4 Drawing Sheets

METHOD OF FORMING A DUAL DAMASCENE STRUCTURE INCLUDING SMOOTHING THE TOP PART OF A VIA

CROSS-REFERENCE TO RELATED APPLICATION

This application claims the priority benefit of Taiwan application serial no. 88116997, filed Oct. 2, 1999.

BACKGROUND OF THE INVENTION

1. Field of the Invention

The present invention relates to a fabrication method for a multilevel metal interconnect (MLM). More particularly, the present invention relates to a dual damascene manufacturing process.

2. Description of the Related Art

Currently, semiconductor manufacturing has entered the stage of deep sub-micron manufacturing in which the device dimensions are being reduced dramatically. A reduction of the device dimensions then causes an increase in the RC time delay. In order to mitigate the RC time delay problem and to accommodate the demand for a high operational speed of electronic devices, various types of material have been employed for the manufacturing of the metal line and the inter-metal dielectrics (IMD) to increase the reliability and the speed of the devices.

By the backend of the manufacturing of a semiconductor device, the width of the metal line has been gradually decreased and correspondingly, the current density to be supported by the metal line slowly increases. As a result, the metal line, which is conventionally formed with aluminum, is easily affected by electron migration (EM), leading to a reduction of device reliability.

In order to resolve the problem mentioned in the above, copper, which has a lower resistance and a low electron migration effect, has been chosen for use in the manufacturing of the metal line of a semiconductor device.

Copper, however, is not easily etched with the common etchants. The conventional approach, for example, drying etching the metal, cannot be used when manufacturing a copper metal line. A dual damascene manufacturing process is thus used, instead.

FIGS. 1A to 1E are schematic, cross-sectional views showing the dual damascene manufacturing process according to the prior art.

Referring to FIG. 1A, a silicon oxide layer 102 is formed covering a substrate 100, followed by forming a silicon nitride layer 104 to cover the silicon oxide layer 102. Another silicon oxide layer 106 is further formed to cover the silicon nitride layer 104. The silicon oxide layer 102, the silicon nitride layer 104 and the silicon oxide layer 106, formed by, for example, plasma enhanced chemical vapor deposition (PECVD), serve as the inter-metal dielectrics.

As shown in FIG. 1B, photolithography and etching are further conducted to form a trench line 108 in the silicon oxide layer 106. During the definition of the trench line 108, the silicon nitride layer 104 serves as an etching stop layer, preventing an over-etching from occurring during the formation of the trench line 108.

Referring to FIG. 1C, photolithography and etching are further conducted to define the silicon nitride layer 104 and the silicon oxide layer 102 to form a via 110 under the trench line 108.

Continuing to FIG. 1D, a barrier layer 112 and a copper layer 114 are sequentially formed to fill the trench line 108 and the via 110 and to cover the silicon oxide layer 106. The barrier layer 112 is, for example, titanium nitride (TiN). The barrier layer 112 and the copper layer 114 are formed by, for example, physical vapor deposition (PVD) or chemical vapor deposition (CVD).

As shown in FIG. 1E portions of the barrier layer 112 (FIG. 1D) and the copper layer 114 (FIG. 1D), which are covering the surface of the silicon oxide layer 106, are removed, leaving the barrier layer 112a and the copper layer 114a in the trench line 108 and in the via 110. The barrier layer 112 and the copper layer 114 are removed by, for example, chemical mechanical polishing (CMP).

The profiles of the trench line 108 and the via 110 formed according to the above manufacturing process, however, are sharp. The issue of a high aspect ratio (AR) becomes even more significant when the dimensions of a semiconductor device are reduced. A good conformity with the subsequently formed barrier layer and copper layer is thus difficult to achieve. Furthermore, voids and seams are easily formed in the center of the copper layer 114 in the via 110, leading to a decrease of the reliability of the metal interconnect.

SUMMARY OF THE INVENTION

Based on the foregoing, a dual damascene manufacturing process is provided, in which a larger and smoother opening is formed at the top part of the via to prevent the problem of voids and seams which are being formed in the via and the trench line.

Accordingly, the current invention provides a dual damascene manufacturing process, which is applicable to a dual damascene structure. The dual damascene structure is formed by forming sequentially a first dielectric layer with a spin-on-glass approach, an etching stop layer and a thermally stable second dielectric layer on a substrate, wherein a via is formed in the first dielectric layer and a trench line is formed in the second dielectric layer. The via is located under the trench line, and the etching stop layer at the bottom of the trench line is removed. Thereafter, a thermal treatment is conducted to smooth the surface of the first dielectric layer at the bottom of the trench line and in the via to result in a larger and a smoother opening at the top part of the via. A barrier layer is then formed, covering the second dielectric layer, the trench line and the via, followed by forming a metal layer to cover the barrier layer, and to fill the trench line and the via. Subsequently, the barrier layer and the metal layer on the surface of the second dielectric layer are removed.

The fabrication of the dual damascene structure according to the present invention further includes providing a substrate using a spin-on-glass method to form a first dielectric layer to cover the substrate, followed by forming an etching stop layer to cover the first dielectric layer. A first photolithography and etching is conducted to define the etching stop layer and to form an opening, wherein the opening is used to define the position of the subsequently formed via. Thereafter, a thermally stable second dielectric layer is formed, covering the etching stop layer and the opening. A second photolithography and etching is conducted to define the second dielectric layer and to form a trench line in the second dielectric layer. Concurrently, using the etching stop layer as an etching mask, a via is formed in the first dielectric layer through the opening, such that the via is located under the trench line. The etching stop layer at the bottom of the trench line is then removed. After the formation of the dual damascene structure, a thermal treatment is then conducted to smooth the surface of the first dielectric layer at the bottom of the trench line and in the via to form a larger and smoother opening on the top part of the via. A barrier layer and a metal layer are further formed to fill the trench line and the via, wherein the barrier layer and the metal layer on the second dielectric layer are thus subsequently removed The via formed according to the present version of the invention comprises a larger and smoother opening even though the dimensions of the via are further being reduced to accommodate the current design rule of the manufacturing of a semiconductor device. The subsequently formed barrier layer and metal layer, as a result, have a good conformity with the underlying structure.

A high aspect ratio due to the reduction of the dimensions of the via as seen in the conventional practice would lead to the formation of voids and seams in the center of the via, causing the reliability of the metal interconnect to decrease. The via formed according to the present version of the invention, in contrast, comprises a larger and a smoother opening at the top part of the via, the problem associated with the formation of voids and seams in the via is thus avoided. Without the presence of voids and seams, the reliability of the metal interconnect is thus increased.

Furthermore, the quality of the barrier layer and the metal layer formed by physical vapor deposition is better than that formed by chemical vapor deposition, and the cost for a physical vapor deposition process is lower. The step coverage capability of physical vapor deposition, however, is inferior. Since the opening formed on the top part of the via of the present invention comprises a larger and smoother opening, the step coverage capability of physical vapor deposition is improved when the barrier layer and metal layer are formed. The barrier layer and the metal layer are thereby formed with a better film characteristic, a lower cost, and a better step coverage capability.

Generally speaking, the present invention provides a more flexible design rule and a more simplified manufacturing process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

FIGS. 2A to 2E are schematic, cross-sectional views showing the dual damascene manufacturing process according to the present invention.

Figure 1A:
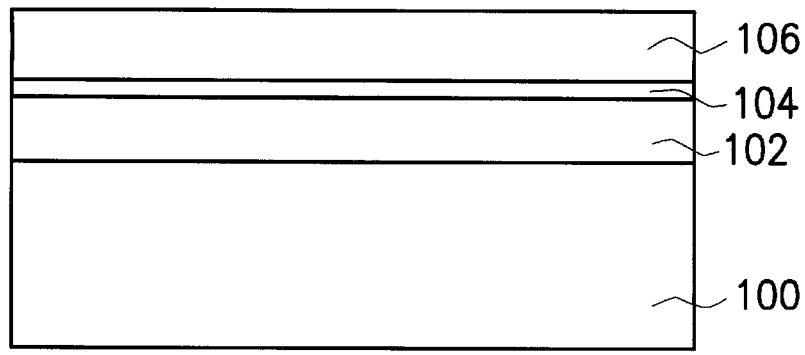
FIGS. 1A to 1E are schematic, cross-sectional views showing the dual damascene manufacturing process according to the prior art.
Figure 1B:
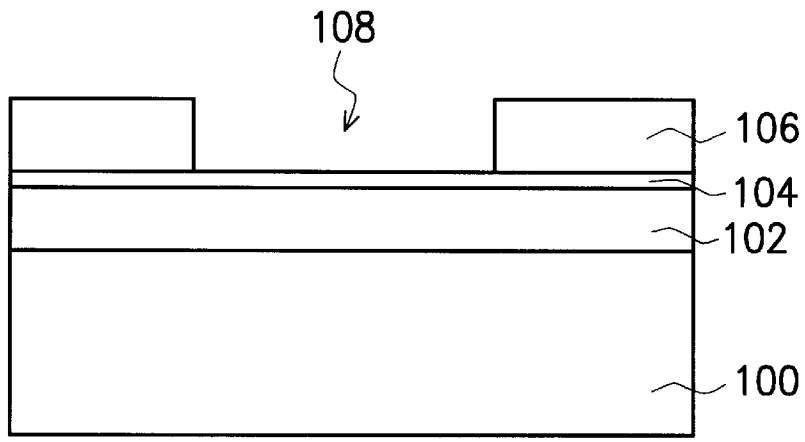
Figure 1C:
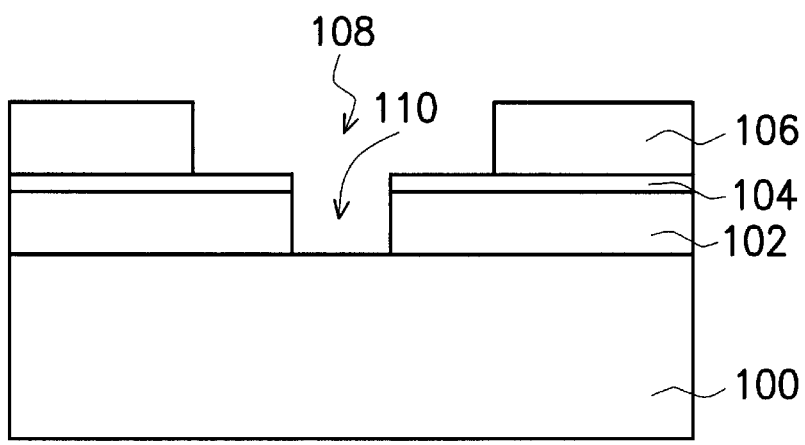
Figure 1D:
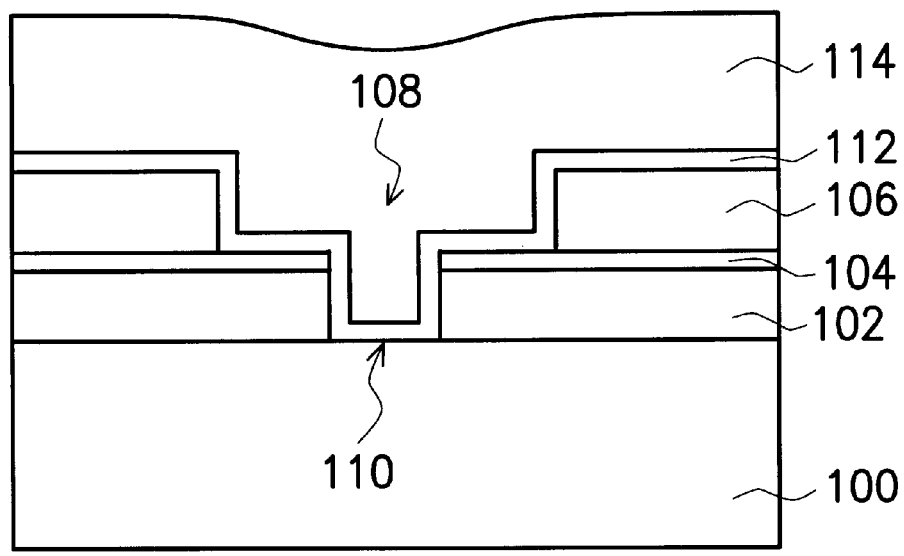
Figure 1E:
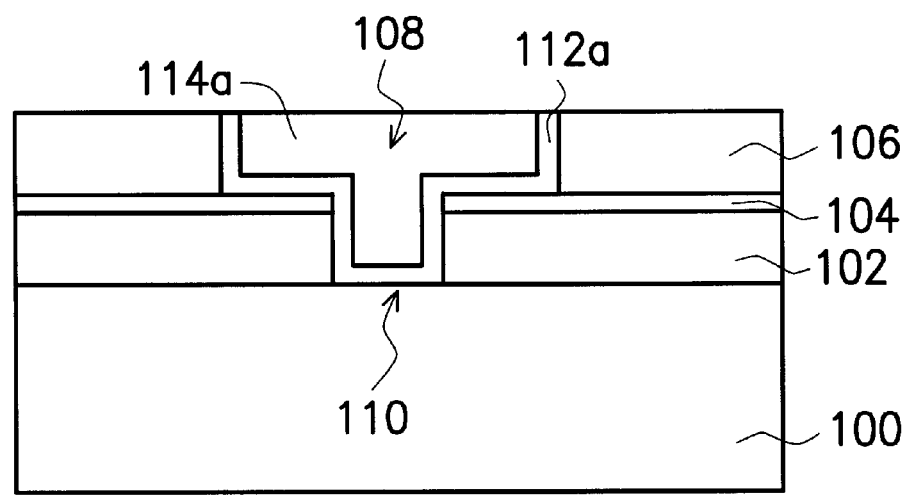
Figure 2A:
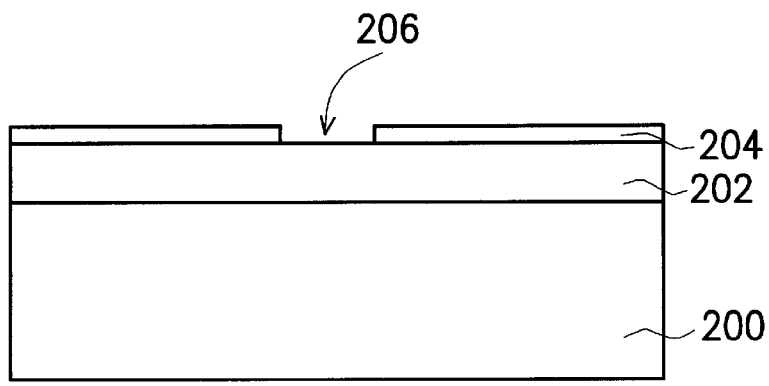
FIGS. 2A to 2E are schematic, cross-sectional views showing the dual damascene manufacturing process according to the present invention.

Referring to FIG. 2A, a dielectric layer 202 is formed to cover a substrate 200, wherein the dielectric layer 202 has a low dielectric constant (k). A low dielectric constant dielectric layer is generally referred to as a dielectric layer having a dielectric constant that is lower than the dielectric constant of silicon oxide, wherein the dielectric constant of silicon oxide is about 3.9.

The dielectric layer 202 is, for example, polyimide, fluorinated polyimide, polymer, FLARE type of organic materials or hydrogen silsesquioxane (HSQ) or methylsequioxane (MSQ) type of inorganic materials, and is formed by a spin-on-glass method.

Thereafter, an etching stop layer 204 is formed to cover the dielectric layer 202. The etching stop layer 204, such as a silicon nitride layer, is formed by, for example, plasma-enhanced chemical vapor deposition.

Photolithography and etching are then conducted to define the etching stop layer 204 and form an opening 206 which defines the position of the subsequently formed via.

Figure 2B:
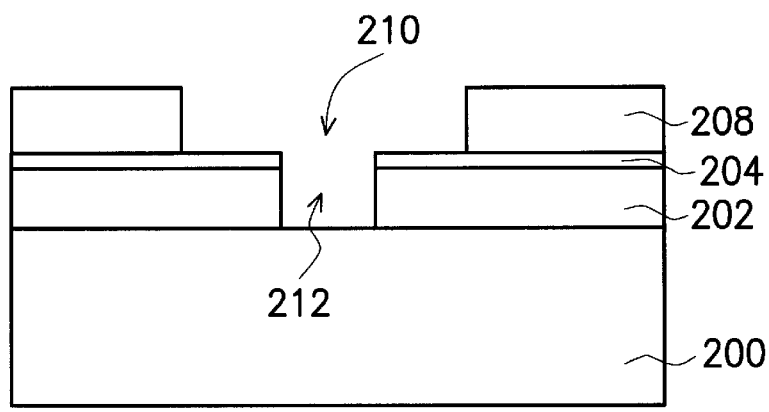

Continuing to FIG. 2B, a dielectric layer 208 is formed, covering the etching stop layer 204 and the opening 206, wherein the dielectric layer 208 is, for example, a thermally stable dielectric layer with a low dielectric constant and is formed by, for example, chemical vapor deposition.

After this, photolithography and etching are conducted to form a trench line 210 in the dielectric layer 208. Concurrently, using the etching stop layer 204 as an etching mask, a via 212 is formed in the dielectric layer 202 through the opening 206 (FIG. 2A), wherein the via 212 is formed under the trench line 210.

At this point, the dual damascene structure is completed. The dual damascene structure formed according to the conventional practice is also applicable to the present invention.

Figure 2C:
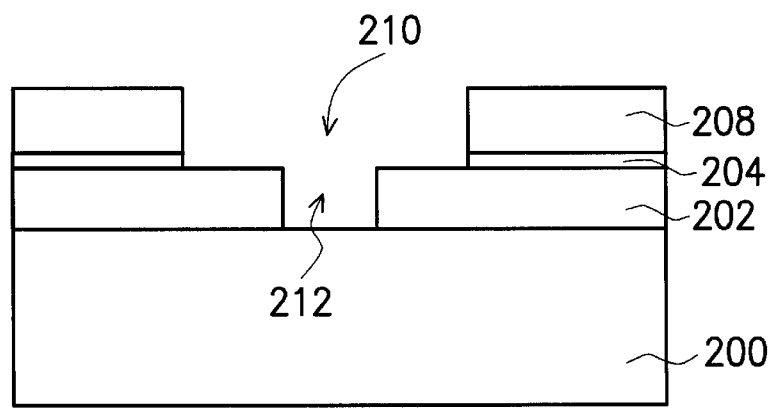

Referring to FIG. 2C, the exposed etching stop layer 204 at the bottom of the trench line 210 is removed by, for example, reactive ion etching (RIE) to expose a portion of the dielectric layer 202.

Figure 2D:
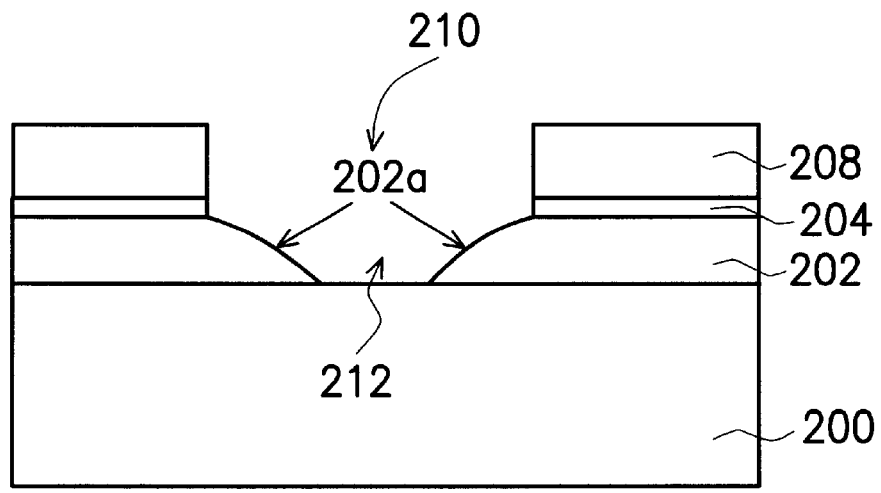

Referring to FIG. 2D, a thermal treatment is conducted, wherein the manufacturing temperature and duration are optimally controlled according to the type of materials of the dielectric layer 202, to smooth the surface 202a of the dielectric layer 202 at the bottom of the trench line 210 and in the via 212. A larger and smoother opening is thus formed at the top part of the via 212.

Since the dielectric layer 208 is a thermally stable dielectric layer, its profile remains unchanged during the thermal treatment. The dielectric layer 208 can be formed from an inorganic type of material. The dielectric layer 208 is formed by, for example, chemical vapor deposition.

Figure 2E:
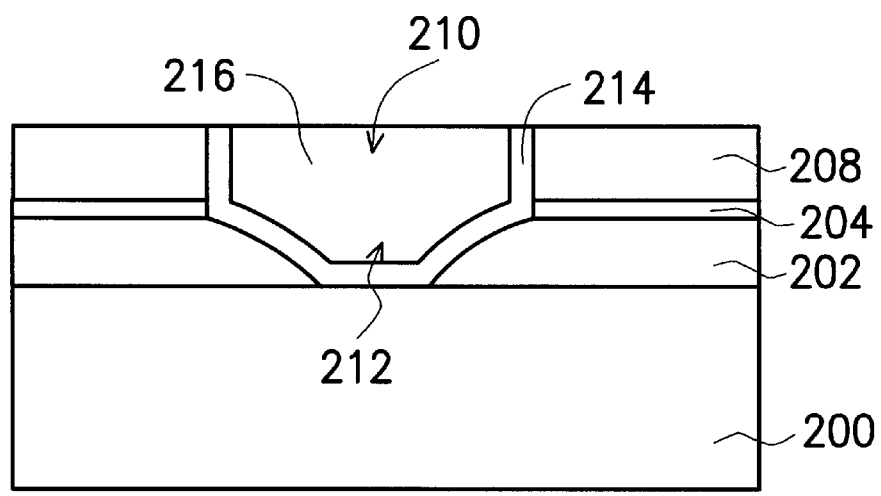

Referring to FIG. 2E, a barrier layer 214 is formed on the sidewalls of the trench line 210 and the via 212, followed by filling the trench line 210 and the via 212 with a metal layer 216. The barrier layer 214 and the metal layer 216 are formed by, for example, forming a barrier layer (not shown) to cover the dielectric layer 208, the trench line 210 and the via 212, followed by forming a metal layer (not shown) to cover the barrier layer, and to fill the trench line 210 and the via 212. After this, a planarization procedure, for example, chemical mechanical polishing, is conducted to remove the part of the barrier layer and the metal layer on the surface of the dielectric layer 208.

The barrier layer 214, such as a titanium nitride, tungsten nitride (WN) or tantalum nitride (TaN) layer, is formed by, for example, physical vapor deposition or chemical vapor deposition.

The metal layer 216, such as an aluminum or copper (including aluminum alloy and copper alloy) layer, is formed by physical vapor deposition or chemical vapor deposition.

According to the preferred embodiment of the present invention, after the formation of the dual damascene structure, the etching stop layer at the bottom of the trench line is removed. A thermal treatment is performed to smooth the surface of the dielectric layer at the bottom of the trench line and in the via to form a larger and smoother opening at the top part of the via, followed by filling the trench line and the via with the barrier layer and the metal layer.

By applying the present invention, the via formed comprises a larger and smoother opening. As a result, the barrier layer and the metal layer, formed subsequently, have a good conformity even when the via dimensions are reduced to accommodate the demands of a more economic design rule.

A high aspect ratio due to the reduction of the via dimensions as in the conventional practice would lead to the formation of voids and seams in the center of the via. The via formed according to the present version of the invention, in contrast, comprises a larger and smoother opening, so the problem associated with the formation of voids and seams is thus prevented. Without the presence of voids and seams, the reliability of the metal interconnect is thus increased.

Although the quality of the barrier layer and the metal layer formed by physical vapor deposition is better than that formed by chemical vapor deposition, and the cost for physical vapor deposition is lower. The step coverage capability with physical vapor deposition, however, is inferior. Since the opening formed on the top part of the via of the present invention comprises a larger and smoother opening, the step coverage capability with physical vapor deposition is improved when the barrier layer and metal layer are formed. The barrier layer and the metal layer of the present invention are thus formed with a better thin film characteristic, a lower cost, and a better step coverage capability.

The present invention provides a more flexible design rule and a more simplified manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene manufacturing method, which is applicable on a dual damascene structures, wherein said dual damascene structure is formed by sequentially stacking a first dielectric layer using a spin-on glass method, an etching stop layer and a thermally stable second dielectric layer, a via is formed in said first dielectric layer, a trench line is formed in said second dielectric layer such that said via is located under said trench line, and said etching stop layer at a bottom of said trench line is removed, said dual damascene manufacturing method comprising the steps of:

conducting a thermal treatment to smooth out said first dielectric layer at said bottom of said trench line and in said via to form a larger and smoother opening at a top part of said via;

forming a barrier layer to cover said second dielectric layer, said trench line and said via;

forming a metal layer to cover said barrier layer and to fill said trench line and said via; and removing said barrier layer and said metal layer on a surface of said second dielectric layer.

2. The dual damascene manufacturing method according to claim 1, wherein a material for said first dielectric layer is selected from a group of materials consisting of polyimide, fluorinated polyimide, polymer, FLARE, hydrogen silsesquioxane (HSQ) and methylsequioxane (MSQ).

3. The dual damascene manufacturing method according to claim 1, wherein said etching stop layer includes silicon nitride.

4. The dual damascene manufacturing method according to claim 1, wherein said second dielectric layer is formed by chemical vapor deposition.

5. The dual damascene manufacturing method according to claim 1, wherein a material for said barrier layer is selected from a group consisting of titanium nitride, tungsten nitride and tantalum nitride.

6. The dual damascene manufacturing method according to claim 1, wherein a material for said metal layer is selected from a group consisting of aluminum, copper, aluminum alloy and copper alloy.

7. A dual damascene manufacturing process comprising the steps of: providing a substrate;

forming a first dielectric layer by a spin-on-glass method to cover said substrate;

forming an etching stop layer to cover said first dielectric layer;

defining the etching stop layer to form an opening;

forming a thermally stable second dielectric layer to cover said etching stop layer and said opening;

defining said second dielectric layer to form a trench line in said second dielectric layer and concurrently forming a via in said first dielectric layer under said trench line;

removing said etching stop layer at a bottom of said trench line;

conducting a thermal treatment to smooth a surface of said first dielectric layer at said bottom of said trench line and in said via to form a larger and smoother opening at a top part of said via;

forming a barrier layer to cover said second dielectric layer, said trench line and said via;

forming a metal layer to cover said barrier layer and to fill said trench line and said via; and;

removing said barrier layer and said metal layer on a surface of said second dielectric layer.

8. The dual damascene manufacturing process according to claim 7, wherein a material for said first dielectric layer is selected from a group of materials consisting of polyimide, fluorinated polyimide, polymer, FLARE, hydrogen silsesquioxane (HSQ) and methylsequioxane (MSQ).

9. The dual damascene process according to claim 7, wherein said etching stop layer includes silicon nitride.

10. The dual damascene manufacturing process according to claim 7, wherein said second dielectric layer is formed by chemical vapor deposition.

11. The dual damascene manufacturing process according to claim 7, wherein a material for said barrier layer is selected from a group of materials consisting of titanium nitride, tungsten nitride and tantalum nitride.

12. The dual damascene manufacturing process according to claim 7, wherein a material for said metal layer is selected from a group consisting of aluminum, copper, aluminum alloy and copper alloy.

13. The dual damascene manufacturing process according to claim 7, wherein said etching stop layer is defined by photolithography and etching.

14. The dual damascene manufacturing process according to claim 7, wherein said second dielectric layer is defined by photolithography and etching.

15. The dual damascene manufacturing process according to claim 7, wherein said etching stop layer serves as an etching mask during the formation of said via in said first dielectric layer.

16. A fabrication method for a multi-level metal interconnect and a via plug, the method comprising the steps of:

provide a substrate;

forming a low dielectric constant first dielectric layer by a spin-on-glass method to cover said substrate;

forming a silicon nitride layer to cover said first dielectric layer;

defining said silicon nitride layer to form an opening;

forming a thermally stable, low dielectric constant second dielectric layer to cover said silicon nitride layer and said opening;

forming a trench line in said second dielectric layer and concurrently forming a via in said first dielectric layer through said opening;

removing said silicon nitride layer at a bottom of said trench line;

conducting a thermal treatment to smooth out a surface of said first dielectric layer at said bottom of said trench line and in the via and to form a larger and smoother opening at a top part of said via;

forming a barrier layer to cover said second dielectric layer, said trench line and said via;

forming a metal layer to cover said barrier layer and to fill said trench line and said via, wherein said metal layer in said trench line serves as said multi-level metal interconnect and said metal layer in said via serves as said via plug; and removing said barrier layer and said metal layer at a surface of the second dielectric layer.

17. The fabrication method for a multi-level metal interconnect and a via plug according to claim 16, wherein a material for said first dielectric layer is selected from a group of materials consisting of polyimide, fluorinated polyimide, polymer, FLARE, hydrogen silsesquioxane (HSQ) and methylsequioxane (MSQ).

18. The fabrication method for a multi-level metal interconnect and a via plug according to claim 16, wherein said silicon nitride layer is defined by photolithography and etching.

19. The fabrication method for a multi-level metal interconnect and a via plug according to claim 16, wherein said second dielectric layer is formed by chemical vapor deposition.

20. The fabrication method for a multi-level metal interconnect and a via plug according to claim 16, wherein said second dielectric layer is defined by photolithography and etching.

21. The fabrication method for a multi-level metal interconnect and a via plug according to claim 16, wherein said silicon nitride layer serves as an etching mask during the formation of said via in said first dielectric layer.

22. The fabrication method for a multi-level metal interconnect and a via plug according to claim 16, wherein a material for said barrier layer is selected from a group of materials consisting of titanium nitride, tungsten nitride and tantalum nitride.

23. The fabrication method for a multi-level metal interconnect and a via plug according to claim 16, wherein a material for said metal layer is selected from a group consisting of copper, aluminum, copper alloy and aluminum alloy.

\* \* \* \* \*